United States Patent
Megaw

(10) Patent No.: US 7,612,609 B1
(45) Date of Patent: Nov. 3, 2009

(54) SELF-STABILIZING DIFFERENTIAL LOAD CIRCUIT WITH WELL CONTROLLED COMPLEX IMPEDANCE

(75) Inventor: David James Megaw, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/123,244

(22) Filed: May 19, 2008

(51) Int. Cl.
*H03F 3/45* (2006.01)
(52) U.S. Cl. .................. 330/253; 330/302; 327/111
(58) Field of Classification Search ............... 330/253, 330/302; 327/111
See application file for complete search history.

(56) References Cited

U.S. PATENT DOCUMENTS

| | | | |
|---|---|---|---|
| 4,315,223 A * | 2/1982 | Haque | 330/253 |
| 5,180,932 A * | 1/1993 | Bengel | 327/362 |
| 5,764,086 A | 6/1998 | Nagamatsu et al. | |
| 5,825,209 A * | 10/1998 | Stark et al. | 327/3 |
| 5,854,574 A | 12/1998 | Singer et al. | |
| 5,994,939 A | 11/1999 | Johnson et al. | |
| 6,144,244 A * | 11/2000 | Gilbert | 327/350 |
| 6,462,590 B2 * | 10/2002 | Warwar | 327/108 |
| 6,476,656 B2 | 11/2002 | Dally et al. | |
| 6,650,182 B2 | 11/2003 | Kim et al. | |
| 7,019,590 B1 * | 3/2006 | Megaw | 330/253 |
| 7,110,742 B2 * | 9/2006 | Roufoogaran | 455/333 |
| 7,236,011 B2 * | 6/2007 | Tam | 326/83 |

* cited by examiner

*Primary Examiner*—Patricia Nguyen
(74) *Attorney, Agent, or Firm*—Darby & Darby P.C.; Matthew M. Gaffney

(57) ABSTRACT

A circuit for providing a self-stabilizing, differential load circuit with well controlled complex impedance to an amplifier is described. According to an embodiment, two pairs of transistors in a cross-coupled configuration, a degeneration resistor for each transistor, and parasitic capacitance cancelation capacitors provide a self-stabilizing, differential load. Small signal analysis of the circuit illustrates an impedance of the load circuit to be substantially equal to a combination of impedance values with substantially little dependence on transconductances and incremental resistances of the transistors over an extended frequency range. By employing well matched resistors, impedance of the load to the amplifier can be controlled and common mode feedback loops avoided, because a current source is not employed as a load. The use of parasitic capacitance cancelation capacitors can substantially increase the bandwidth of the amplifier. Furthermore, with transistors, low voltage headroom may be increased and integrated circuit area decreased.

20 Claims, 6 Drawing Sheets

SELF-STABILIZING DIFFERENTIAL LOAD CIRCUIT WITH WELL CONTROLLED COMPLEX IMPEDANCE

FIELD OF THE INVENTION

The present invention relates to amplifiers, and in particular, to a method and circuit for providing a self-stabilizing, differential load circuit with well controlled complex impedance to an amplifier.

BACKGROUND

A wide variety of electronic circuit applications employ differential measurement of two currents and some prescribed amount of rejection of common mode components of the currents. In some applications, the currents being measured may exist in a high DC voltage/current environment, while their information content is ultimately employed in a low voltage/current environment, with demanding requirements for accurate amplification and filtering. As a non-limiting example, various equipment employed by telecommunication service providers utilize subscriber line interface circuits (SLICs) to interface telecommunication signals with phone line wiring that may include substantial DC components.

As another example, fully balanced for differential transimpedance amplifiers may be employed in optical receiver systems, where a current-varying output signal of a photodetector is converted into a voltage signal to be processed by other circuitry. While amplifiers with a balanced load may provide a preferred solution for applications such as those listed above, other considerations such as component count, current dissipation, and the like may result in employment of hybrid circuits.

An amplifier with a balanced differential load offers distinct advantages over a single-ended amplifier or an amplifier with an unbalanced differential load such as a current mirror. Specifically, an amplifier having a balanced differential load significantly enhances noise immunity whether the noise originates from either the positive or negative supply or from a switching event that injects an equal signal into each side of the load. In an amplifier having a balanced differential load, the occurrence of noise will cause a signal which is common to both outputs and, therefore, ideally will not generate a differential signal which can be amplified by subsequent stages. A balanced differential load can be achieved either actively or passively, each method has its own caveats. The simplest method involves using a pair of matched resistors to create a passive differential load. Resistive differential loads tend to have the best matching and the best controlled impedance. The disadvantage is that there is a large IR voltage drop and a relatively large silicon area is needed in order to achieve appreciable gain. An active differential load is generally comprised of two transistors connected either as current sources or as diodes. When used as current sources, a separate amplifier is required in order to provide common-mode feedback (CMFB) to quiescently bias the transistors such that they function as current sources during steady-state operation. Aside from added circuitry and complexity, a CMFB loop may also degrade the stability of a system. In addition, the output impedance of an amplifier with a current source load is determined by either channel length modulation (MOSFETs) or base width modulation (BJTs), each of which can cause large variations in gain and pole locations of the amplifier because of their control difficulties. Normally diode loads have higher voltage loss than current sources and generally do not provide high impedances.

An amplifier with a balanced differential load may provide significantly improved noise immunity compared to a single-ended amplifier or an amplifier with an unbalanced load such as a current mirror.

Thus, it is with respect to these considerations and others there is disclosed a new type of balanced differential load having the advantageous attributes of resistive loading: well controlled impedance, improved matching and no need for CMFB, as well as the benefits of active loading with low voltage loss and smaller area requirements.

SUMMARY OF THE INVENTION

A circuit for providing a self-stabilizing, differential load circuit with well controlled complex impedance to an amplifier is disclosed. According to an embodiment, two pairs of transistors in a cross-coupled configuration, a degeneration resistor for each transistor, and parasitic capacitance cancelation capacitors provide the self-stabilizing, differential load. Small signal analysis of the circuit illustrates that an impedance of the load circuit is substantially equal to a combination of impedance values with substantially little dependence on transconductances and incremental resistances of the transistors over an extended frequency range. By employing well matched resistors, the impedance of the load to the amplifier can be well controlled, and common mode feedback loops avoided, because a current source is not employed as a load. The application of capacitors selectively located in the circuit effectively extends the differential load's bandwidth. Furthermore, by using transistors, voltage loss is low and integrated circuit area required is decreased.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment or an embodiment combining software and hardware aspects. The following detailed description is, therefore, not to be taken in a limiting sense.

Briefly stated, the present invention is directed to a circuit for providing a self-stabilizing, differential load circuit with well controlled complex impedance to an amplifier.

According to an embodiment, two pairs of transistors in a specific cross-coupled configuration, a degeneration resistor for each transistor, and parasitic capacitance cancelation capacitors provide the self-stabilizing, differential load. Small signal analysis of the circuit illustrates an impedance of the load circuit to be substantially equal to a combination of impedance values with substantially little dependence on transconductances and incremental resistances of the transistors over an extended frequency range.

By employing well matched resistors, the impedance of the load to the amplifier can be well controlled, and a separate amplifier for a common mode feedback loop avoided, because a current source is not employed as a load. Furthermore, the use of transistors may enable increased low voltage headroom and decreased integrated circuit area compared to purely resistive loads.

Even though in the present specification impedance is explained and discussed in terms of capacitance and capacitors, those skilled in the relevant arts appreciate that the impedance of a circuit or a component may be due to other electrical characteristics such as inductance, or a combination of capacitance and inductance. Inductance in a circuit may be due to the current flowing in signal and/or power lines and traces. Accordingly, in some illustrative embodiments and applications inductors and inductances may be used to determine and control circuit impedance.

Figure 1:
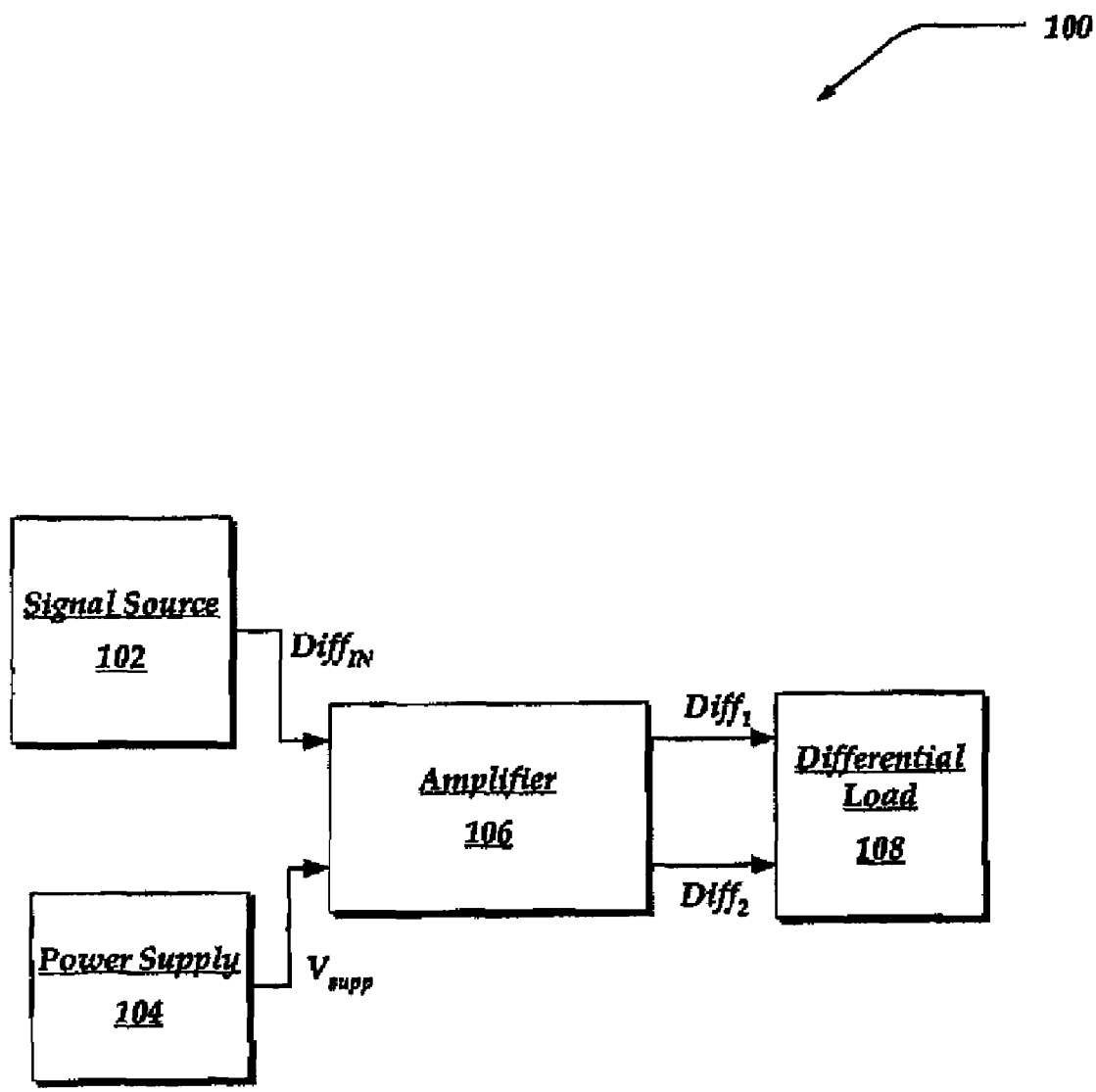
FIG. 1 is a block diagram illustrating an environment, in which one embodiment of a self-stabilizing differential load circuit according to the present invention may be implemented.

FIG. 1 illustrates block diagram 100 of an environment, in which one embodiment of a self-stabilizing differential load circuit according to the present invention may be implemented. Block diagram 100 includes signal source 102, power supply 104, amplifier 106, and differential load 108.

As mentioned previously, a balanced differential load may significantly enhance noise immunity from negative or positive power supply inputs, or from a switching event which injects equal charge into each side of the load. In a balanced differential load such noise may result in a signal common to both outputs, ideally generating no differential signal and, therefore, will not be amplified by subsequent amplifier stages.

Resistive differential loads may tend to have better matching and control of impedance compared to other types of loads, but consume relatively large amount of voltage headroom due to voltage drop across the load resistors, and increase an integrated circuit area, especially if appreciable gain is desired.

Active loads, generally, comprise two transistors arranged to operate as a current source or a diode. If the transistors are used as a current source, a separate amplifier may be employed to provide common-mode feedback to bias the transistors such that they operate as a current source in steady-state mode. Aside from added circuitry and complexity, the common-mode feedback loop may also degrade the stability of the amplifier. Furthermore, an output impedance of a current source is determined by either channel length modulation (for MOSFET's) or base width modulation (for BJT's), both of which are generally difficult to control. This can lead to relatively large variations in a gain and pole locations of the amplifier.

Diode loads, generally, consume more voltage headroom than current sources, and may not provide as high impedances as resistive loads.

Referring to FIG. 1, signal source 102 is arranged to provide differential input signal $Diff_{IN}$ to amplifier 106 and power supply 104 is arranged to provide supply voltage $V_{supp}$ to amplifier 106. In an integrated circuit, power supply 104 may be arranged to provide supply voltage to additional circuits as well.

Amplifier 106 is a differential amplifier that is coupled to differential load 108. Amplifier 106 may include virtually any type of differential amplifier circuit known to those skilled in the art. Differential load 108 is discussed in more detail below, in conjunction with FIGS. 2 and 3.

FIG. 1 shows a particular arrangement of inputs and outputs of the various components. Other arrangement of the components may be implemented without departing from the scope and spirit of the present invention.

Figure 2:
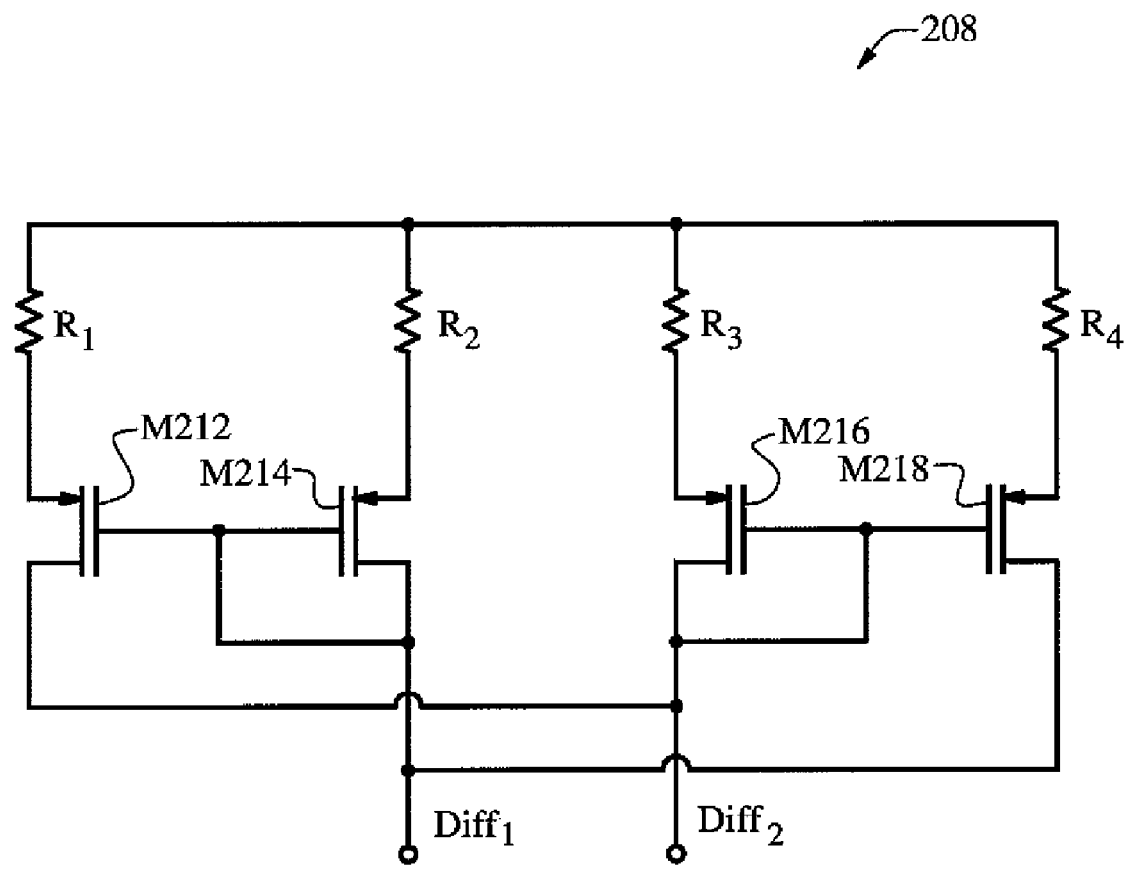
FIG. 2 schematically illustrates a prior art embodiment of the self-stabilizing differential load circuit of FIG. 1.

FIG. 2 schematically illustrates an embodiment of a prior art self-stabilizing, differential load circuit 208. Self-stabilizing, differential load circuit 208 includes transistors M212, M214, M216, M218 and resistors $R_1$-$R_4$.

As illustrated in FIG. 2, PMOS transistors M212 and M214 are coupled at their gate terminals with the gate terminals also coupled to a drain terminal of M214. The drain terminal of M214 is arranged to receive one half of differential input signal $Diff_1$.

PMOS transistors M216 and M218 are coupled together in a similar manner to M212 and M214. A drain terminal of M216 is arranged to receive another half of the differential input signal $Diff_2$. A drain terminal of M212 is cross-coupled to the drain terminal of M216, and a drain terminal of M218 is cross-coupled to the drain terminal of M214.

Degeneration resistors $R_1$-$R_4$ are coupled together at one terminal. Another terminal of each degeneration resistor $R_1$-$R_4$ is coupled to a source terminal of transistors M212, M214, M216, and M218, respectively.

FIG. 2 shows a prior art arrangement of inputs and outputs of the various components where all of the components of circuit 208 may be included in the same chip or one or more of the components may be off-chip.

Figure 3:
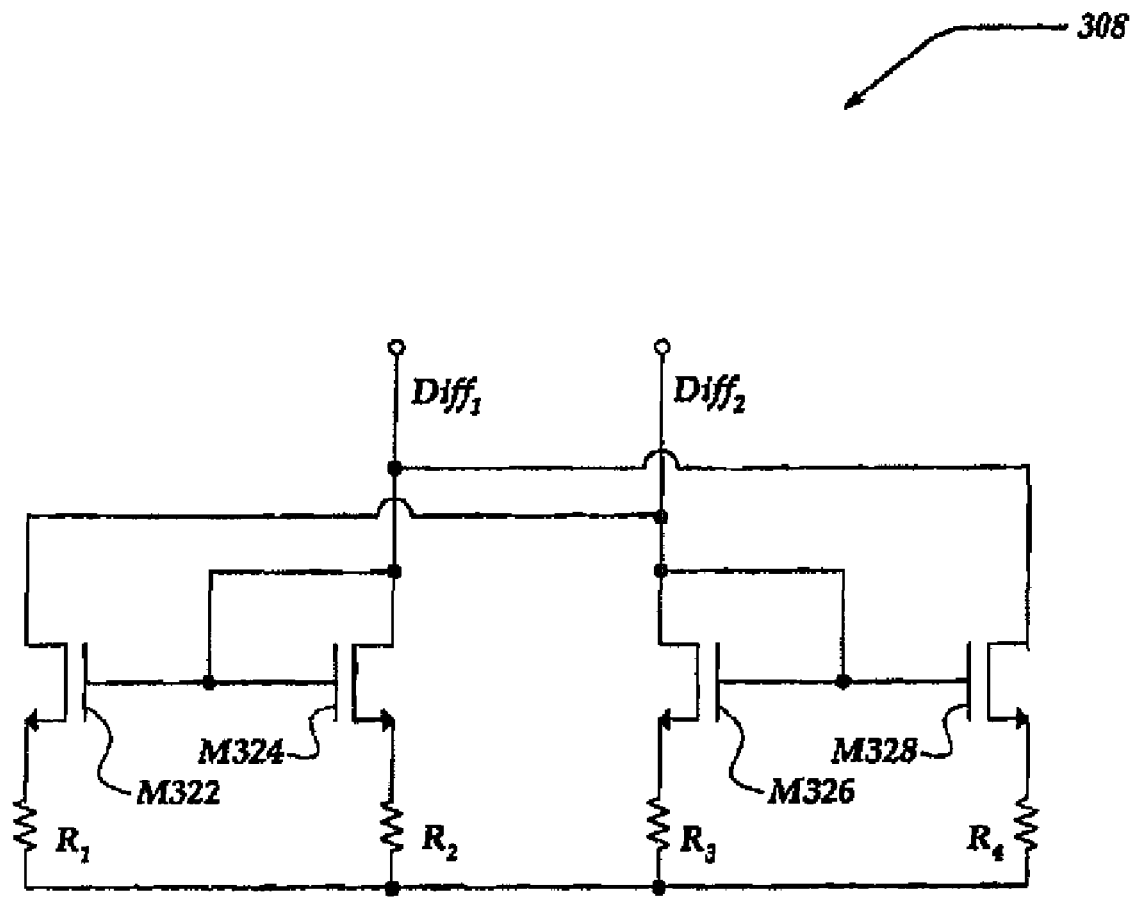
FIG. 3 schematically illustrates another prior art embodiment of the self-stabilizing differential load circuit of FIG. 1.

FIG. 3 schematically illustrates another prior art embodiment of a self-stabilizing differential load circuit 308. Self-stabilizing differential load circuit 308 includes transistors M322, M324, M326, M328 and resistors $R_1$-$R_4$.

Differential load circuit 308 can employ NMOS transistors. Transistors M322, M324, M326, M328 and resistors $R_1$-$R_4$ shown in FIG. 3 operate in substantially the same way as those in FIG. 2 discussed above. Equations (1)-(15) shown below and discussed in conjunction with FIG. 4 are valid for differential load circuit 308 as well, but the directions of differential currents and signs of transconductances are reversed.

In FIG. 3 all of the components of differential circuit 308 may be included in the same chip or one or more of the components may be off-chip.

Figure 4:
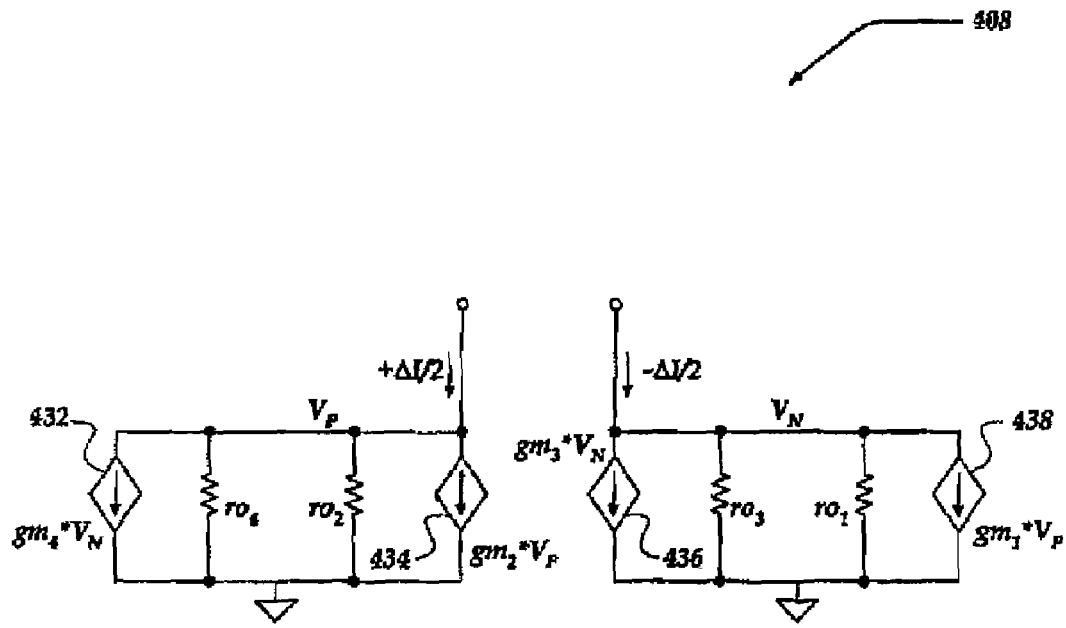
FIG. 4 schematically illustrates a small signal model of a non-degenerated embodiment of the self-stabilizing differential load circuit of FIG. 2.

FIG. 4 schematically illustrates small signal model 408 of differential load circuit 208 of FIG. 2. Small signal model 408 includes voltage controlled current sources 432, 434, 436, 438, resistors $ro_1$-$ro_4$ and $r\pi_1$-$r\pi_4$.

Small signal model 408 shows voltage controlled current sources 432, 434, 436, 438 representing transistors M212, M214, M216, and M218 of differential load circuit 208 of FIG. 2. Resistances in the circuit are represented by resistors $ro_1$-$ro_4$ and $r\pi_1$-$r\pi_4$. Currents provided by current sources 432, 434, 436, 438 are $gm_4 * V_N$, $gm_2 * V_P$, $gm_3 * V_N$, and $gm_1 * V_P$, respectively. Differential input currents are represented by $\Delta I/2$ and $-\Delta I/2$.

If degeneration resistances are neglected, differential input current may be expressed as:

$$\frac{\Delta I}{2} = (gm_4 * V_N) + (gm_2 * V_P) + \left(\frac{V_P}{ro_4}\right) + \left(\frac{V_P}{ro_2}\right), \text{ and} \quad (1)$$

$$-\frac{\Delta I}{2} = (gm_3 * V_N) + (gm_1 * V_P) + \left(\frac{V_N}{ro_3}\right) + \left(\frac{V_N}{ro_1}\right). \quad (2)$$

Equations (1) and (2) may be rearranged as:

$$\frac{\Delta I}{2} - (gm_4 * V_N) = V_P * \left(gm_2 + \frac{1}{ro_4} + \frac{1}{ro_2}\right), \text{ and} \quad (3)$$

$$-\frac{\Delta I}{2} - (gm_1 * V_P) = V_N * \left(gm_3 + \frac{1}{ro_3} + \frac{1}{ro_1}\right). \quad (4)$$

From equations (3), and (4), voltages $V_P$ and $V_N$ may be expressed as:

$$V_P = \frac{\left(\frac{\Delta I}{2} - gm_4 * V_N\right)}{\left(gm_2 + \frac{1}{ro_4} + \frac{1}{ro_2}\right)}, \text{ and} \quad (5)$$

$$V_N = \frac{\left(-\frac{\Delta I}{2} - gm_1 * V_P\right)}{\left(gm_3 + \frac{1}{ro_3} + \frac{1}{ro_1}\right)}. \quad (6)$$

If following assumptions are made:

(7) $gm_1 = gm_4$ and $gm_3 = gm_2$, (8)

$$gm_2 ? \frac{1}{ro_4}, \frac{1}{ro_2}$$

and $$gm_3 ? \frac{1}{ro_3}, \frac{1}{ro_1},$$

$V_P$ and $V_N$ may be expressed as:

(9)

$$V_P \cong \frac{\left(\frac{\Delta I}{2} - gm_1 * V_N\right)}{gm_2},$$

$$V_N \cong \frac{\left(-\frac{\Delta I}{2} - gm_4 * V_P\right)}{gm_3} = \frac{\left(-\frac{\Delta I}{2} - gm_1 * V_P\right)}{gm_2}. \quad (10)$$

Next, $V_P$ and $V_N$ may be used in determining load impedance $Z_{LOAD}$ as:

$$Z_{LOAD} = \frac{V_P - V_N}{\Delta I} = \frac{1}{\Delta I}\left(\frac{\Delta I + gm_1 * (V_P - V_N)}{gm_2}\right) = \frac{1}{(gm_2 - gm_1)}. \quad (11)$$

As equation (11) illustrates, an approximation of the load impedance based on assumptions (7) and (8) result in determination of the load impedance based on a difference between transconductances of transistors M212 and M216, or transistors M214 and M218 only. Accordingly, a value of the load impedance can be made substantially large by selecting transconductances $gm_1$ and $gm_2$, or $gm_3$ and $gm_4$ substantially equal. As noted above, transconductances are, generally, not easy to control, and an analysis of the differential load circuit with degenerated transistors may provide more practical results where the impedance is dependent on degeneration resistors.

Figure 5:
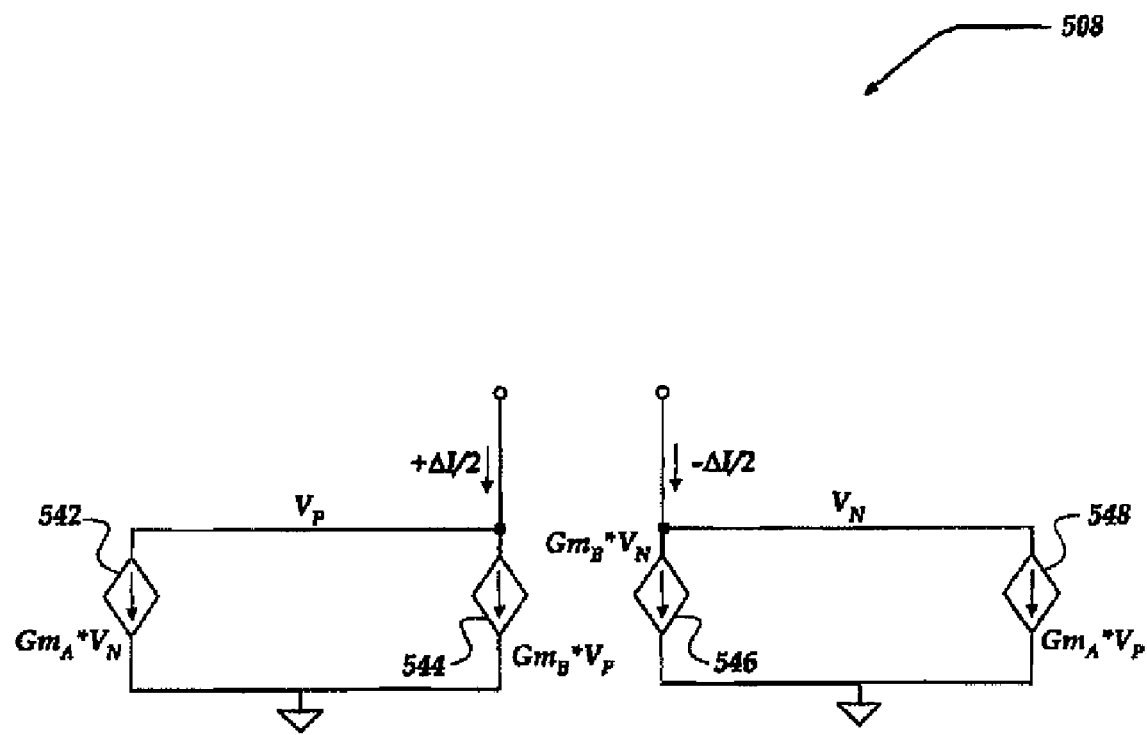
FIG. 5 schematically illustrates a small signal model of a degenerated embodiment of the self-stabilizing differential load circuit of FIG. 2 assuming infinite incremental resistance.

FIG. 5 schematically illustrates small signal model 508 of a degenerated embodiment of self-stabilizing differential load circuit 208 of FIG. 22 assuming infinite incremental resistance. Small signal model 508 includes voltage controlled current sources 542, 544, 546, and 548.

Small signal model 508 shows voltage controlled current sources 542, 544, 546, and 548 representing transistors M212, M214, M216, and M218 of differential load circuit 208 of FIG. 2. Incremental resistances in the circuit are assumed to be infinite. Currents provided by current sources 542, 544, 546, and 548 are $Gm_A * V_N$, $Gm_B * V_P$, $Gm_B * V_N$, and $Gm_A * V_P$, respectively. Differential input currents are again represented by $\Delta I/2$ and $-\Delta I/2$.

Load impedance $Z_{LOAD}$ may be expressed as:

$$Z_{LOAD} = \frac{V_P - V_N}{\Delta I} = \frac{1}{\Delta I}\left(\frac{\Delta I + Gm_A * (V_P - V_N)}{Gm_B}\right) = \frac{1}{(Gm_B - Gm_A)}. \quad (12)$$

Transconductances $Gm_A$ and $Gm_B$ may be expressed as a function of transistor transconductances $gm_1$, $gm_2$, and resistors $R_1$, $R_2$:

$$Gm_A = \frac{gm_1}{(1 + gm_1 * R_1)} \cong \frac{1}{R_1}, \quad (13)$$

if $(gm_1*R_1)\gg 1$, and (14)

$$Gm_B = \frac{gm_2}{(1 + gm_2 * R_2)} \cong \frac{1}{R_2},$$

if $(gm_2*R_2)\gg 1$.

From equations (13) and (14) follows an approximation of $Z_{LOAD}$ as:

$$Z_{LOAD} \cong \frac{R_1 * R_2}{(R_1 - R_2)}, \text{ if } R_1 = R_4, R_2 = R_3. \quad (15)$$

The above analysis suggests that load impedance of differential load circuit 208 depends substantially on degeneration resistors and little on transconductances and incremental resistances of the transistors. Accordingly, transistor mismatch and channel length (base width) modulation may have a negligible effect on $Z_{LOAD}$. Therefore, matching the differential load circuit may depend substantially on a matching of resistors $R_1$-$R_4$. Commonly available technologies are capable of producing better than 1% matching resistors. Consequently, well controlled load circuits are feasible.

A magnitude of the / impedance may be increased by selecting a value of $R_1$ and a value of $R_2$ substantially close to each other. If a difference between resistances of $R_1$ and $R_2$ is selected sufficiently small, impedances similar to current sources may be obtained without employing common mode feedback loops. As a result of employing cross-coupled transistors, low voltage headroom of differential load circuit 208 may approximate that of a dual diode load.

Figure 6:
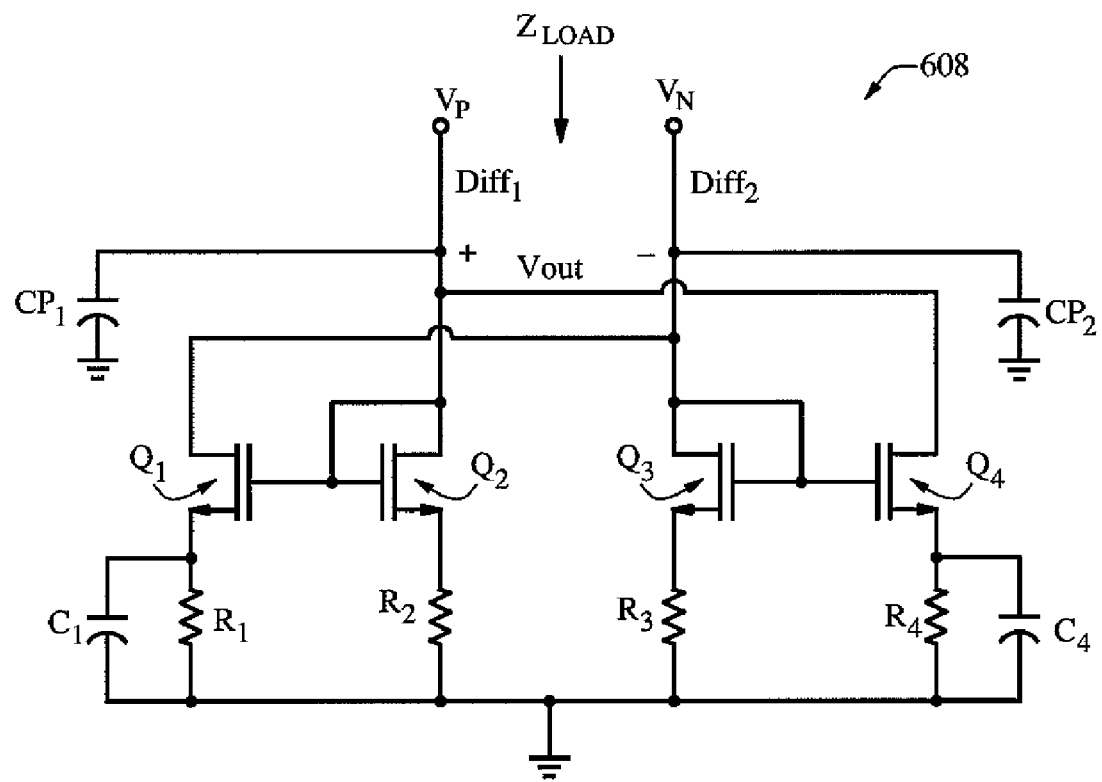
FIG. 6 schematically illustrates an embodiment of self-stabilizing differential load circuit of FIG. 1 in accordance with the principles of this invention.

Referring to FIG. 6, there is shown a schematic diagram of an embodiment of a self-stabilizing differential load circuit 608 in accordance with the principles of the invention with active load and parasitic capacitance on the output and width extending capacitors C1 and C2. Self-stabilizing differential load circuit 708 includes transistors Q1, Q2, Q3, Q4, resistors $R_1$-$R_4$, and capacitances $CP_1$, $CP_2$, $C_1$, and $C_4$.

While differential load circuit 608 is shown employing MOSFET transistors, other technologies such as Bipolar Complementary Metal Oxide Semiconductor (BiCMOS), Heterojunction Bipolar Transistor (HBT), Metal Semiconductor Field Effect Transistor (MESFET), and Bipolar Junction Transistor (BJT) may also be implemented without departing from the scope or spirit of the invention.

As illustrated in FIG. 6, PMOS transistors Q1 and Q2 are coupled at their gate terminals with the gate terminals also coupled to a drain terminal of Q2. The drain terminal of Q2 is arranged to receive one half of differential input signal $Diff_1$.

PMOS transistors Q3 and Q4 are coupled together in a similar manner to Q1 and Q2. Drain terminal of Q3 is coupled to receive another half of the differential input signal $Diff_2$. Drain terminal of Q1 is cross-coupled to the drain terminal of Q3, and drain terminal of Q4 is cross-coupled to the drain terminal of Q2.

Degeneration resistors $R_1$-$R_4$ are coupled together at one terminal. Another terminal of each degeneration resistor $R_1$-$R_4$ is coupled to a source terminal of transistors Q1, Q2, Q3, and Q4, respectively.

Parasitic capacitances $CP_1$ and $CP_2$ may be present at the input to differential load circuit 608 on differential input signals $Diff_1$ and $Diff_2$. Parasitic capacitances $CP_1$ and $CP_2$ may, for example, be due to the output capacitance of an amplifier such as amplifier 106 of FIG. 1, the input capacitance of differential load circuit 708, capacitance along signals $Diff_1$ and $Diff_2$, capacitances associated with circuitry coupled in parallel with differential load circuit 708, or the like.

Parasitic capacitance cancelation capacitors C1 and C4 are respectively coupled in parallel with degeneration resistors $R_1$ and $R_4$. In an embodiment, the values of parasitic capacitance cancelation capacitors C1 and C4 are substantially equal to the values of parasitic capacitances $CP_1$ and $CP_2$ such that the effects of the parasitic capacitances are substantially canceled. These values may, for example, be between substantially 100 femtoFarads and several picoFarads. However, any suitable values can be employed for parasitic capacitance cancelation capacitors C1 and C4. Also, parasitic capacitance cancelation capacitors C1 and C4 can be of any suitable type of capacitors. For example, they may be formed on a monolithic integrated circuit along with other elements of differential load circuit 608 or they may be external components.

A degeneration resistor for a transistor is a value of resistance of an impedance seen at a drain terminal which is not bypassed by an AC signal in whole or in part. If a small signal analysis of differential load circuit 608 is performed neglecting degeneration resistors and assuming that the transconductances of transistors are related as:

$gm_1=gm_4$, and $gm_2=gm_3$, then the load impedance for the differential load circuit 608 may be expressed as:

$$Z_{LOAD} = \frac{1}{(gm_2 - gm_1)}.$$

This relationship illustrates that by selecting values of transconductances $gm_1$ and $gm_2$ that are close to each other, the load impedance may be made substantially large. However, under practical circumstances, transcoductances may not be controlled with sufficient accuracy.

Accordingly, another small signal of differential load circuit 208, as described in more detail in conjunction with FIG. 4, and assuming infinite incremental resistance, may yield with impedance for differential load circuit 608 as:

Zload=R1*R2/(R1−R2)

also assuming $R_1=R_4$, and $R_2=R_3$.

This result indicates that load impedance for differential load circuit 208 may have substantially little dependence on transconductances and incremental resistances of transistors Q1-Q4. A matching of the load impedance may depend substantially on a matching of resistors $R_1$-$R_4$, which may be accomplished relatively easily.

Referring to FIG. 6, all of the components of differential load circuit 608 may be included in the same chip or one or more of the components may be off-chip.

In the analysis that follows,

R2=R3=Ra, and R1=R4=RB, and as noted previously, the load architecture in FIG. 1 was shown to exhibit a differential load impedance characterized by the equation:

$$Z_{LOAD} = \frac{R_A \cdot R_B}{R_B - R_A} \quad (15)$$

As noted above, the ramifications of this relationship are that the prior art circuits of FIGS. 2 and 3 behave almost identically to a resistive load but consume a fraction of the silicon area and voltage headroom. Also, the load impedance can be made arbitrarily large by reducing the difference in resistance between $R_B$ and $R_A$. If higher gain is required, it is not necessary to increase bias current or resistance as it would be in an amplifier with a purely resistive load. Another significant advantage of the novel active load over resistive loading is the ability to extend the bandwidth of the stage through the cancelation of the parasitic capacitance on the output nodes VP and VN. With the embodiment disclosed in FIG. 6, there is disclosed a self-stabilizing differential load circuit with well controlled complex impedance for extending the bandwidth of the load by placing capacitors in parallel with resistors R1 and R4 as shown in FIG. 6.

Referring to FIG. 6, there is shown the circuit with active load parasitic capacitance on the output and with width extending capacitors. The cancellation of the output pole due to C1 and C4 can be understood by extending the analysis of the prior art circuit discussed above to include complex impedances. The analysis presented above can be used when the resistors R1, R2, R3, and R4 are replaced with complex impedances Z1, Z2, Z3, and Z4 respectively. Then $$Z_{LOAD} = \frac{Z_{LO}}{sCpZ_{LO}+1} \quad (2)$$

$$Z_{LO} = \frac{Z_1 Z_2}{Z_1 - Z_2} = \frac{R_A\left(\frac{R_B}{sCcR_B+1}\right)}{\left(\frac{R_B}{sCcR_B+1}\right) - R_A} = \frac{R_A R_B}{-sCcR_A R_B - R_A + R_B} \quad (3)$$

$$Z_{LO} = \frac{\left(\frac{R_A R_B}{R_B - R_A}\right)}{-sCc\left(\frac{R_A R_B}{R_B - R_A}\right)+1} = \frac{R_{LO}}{-sCcR_{LO}+1} \text{ where } R_{LO} = \left(\frac{R_A R_B}{R_B - R_A}\right) \quad (4)$$

$$Z_{LOAD} = \frac{\left(\frac{R_{LO}}{-sCcR_{LO}+1}\right)}{sCp\left(\frac{R_{LO}}{-sCcR_{LO}+1}\right)+1} = \frac{R_{LO}}{(sCp - sCc)R_{LO}+1} \quad (5)$$

If Cc=Cp, $Z_{LOAD}=R_{LO}$ and the stage has infinite bandwidth

Where: Cc=C1=C4, Cp=Cp1=Cp2, $R_A$=R2=R3, and $R_B$=R1=R4

Thus, as the value Cc approaches Cp. The −3 db point of the amplifier's frequency response moves higher out in frequency. In practice, the effect of Cp cannot be completely cancelled. As Cc gets very close to the value of Cp, there will be peaking on the amplifier's frequency response, and if Cc>Cp, the circuit will contain a right-hand plane pole and will become unstable. Therefore, it is possible to extend the bandwidth by an order of magnitude.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A differential load circuit for a differential amplifier, the differential load circuit comprising:
    a first differential input having a first input capacitance;
    a second differential input having a second input capacitance;
    a first pair of transistors coupled to the first and the second differential inputs, the first pair of transistors being coupled to a first component having a complex impedance; and
    a second pair of transistors coupled to the first and the second differential inputs, the second pair of transistors being coupled to a second component having a complex impedance, wherein, the complex impedances of the first and the second components are arranged to increase a bandwidth of the differential load circuit by cancelling the first and the second input capacitances.

2. The differential load circuit of claim 1, wherein the first and the second pairs of transistors are cross-coupled to each other.

3. The differential load circuit of claim 1, wherein the first and the second input capacitances are parasitic.

4. The differential load circuit of claim 1, wherein the first and the second component comprise a first resistor and a first capacitor, and a second resistor and a second capacitor, respectively.

5. The differential load circuit of claim 1, further comprising a first degeneration resistor coupled with the first pair of transistors and a second degeneration resistor coupled with the second pair of transistors.

6. The differential load of claim 1, wherein a load impedance of the differential load circuit is substantially dependent on the complex impedances of the first and the second components.

7. The differential load circuit of claim 1, wherein a load impedance of the differential load circuit is substantially independent of a transconductance of the first and the second pairs of transistors.

8. A differential load circuit for a differential amplifier, the differential load circuit comprising:
    a first pair of matched transistors forming a first current source having a first input, the first input having a first input capacitance;
    a second pair of matched transistors forming a second current source having a second input, the second input having a second input capacitance;
    a first component having a first complex impedance coupled to the first pair of matched transistors; and
    a second component having a second complex impedance coupled to the second pair of matched transistors, wherein the first and the second complex impedances are arranged to cancel the first and the second input capacitances to increase a bandwidth of the differential load circuit.

9. The differential load circuit of claim 8, wherein the first and the second pair of matched transistors are cross-coupled to each other.

10. The differential load circuit of claim 8, wherein the first and the second input capacitances are substantially equal.

11. The differential load circuit of claim 8, wherein the first and the second complex impedances are substantially equal.

12. The differential load circuit of claim 8, wherein the differential load circuit is self-stabilizing.

13. The differential load circuit of claim 8, wherein a load impedance of the differential load circuit is substantially dependent on the first and the second complex impedances.

14. The differential load circuit of claim 8, wherein a load impedance of the differential load is substantially independent of a transconductance of the first and the second pairs of matched transistors.

15. A method of increasing a bandwidth of a differential load circuit of a differential amplifier, the method comprising:
  coupling an active load circuit to a first output and a second output of the differential amplifier, the active load comprising:
    a first differential input having a first input capacitance;
    a second differential input having a second input capacitance;
    a first pair of transistors coupled to the first and the second differential inputs, the first pair of transistors being coupled to a first component having a complex impedance; and
    a second pair of transistors coupled to the first and the second differential inputs, the second pair of transistors being coupled to a second component having a complex impedance; and
  using the complex impedances of the first and the second components to cancel the first and the second input capacitances to increase the bandwidth of the differential load circuit.

16. The method of claim 15, further comprising using a first degeneration resistor coupled with the first pair of transistors and a second degeneration resistor coupled with the second pair of transistors to create an impedance of the differential load circuit.

17. The method of claim 15, wherein an impedance of the differential load circuit is substantially independent of a transconductance of the first and the second pairs of transistors.

18. The method of claim 15, wherein a load impedance of the differential load circuit is substantially dependent on the complex impedances of the first and the second components.

19. The method of claim 15, wherein the complex impedances of the first and the second components each comprise a resistance and at least one of a capacitance and an inductance.

20. The method of claim 19, wherein the using the complex impedances of the first and the second components comprises matching the capacitance of the complex impedances of the first and the second components with the first and the second input capacitances, respectively.

* * * * *

UNITED STATES PATENT AND TRADEMARK OFFICE
CERTIFICATE OF CORRECTION

| | | |
|---|---|---|
| PATENT NO. | : 7,612,609 B1 | Page 1 of 1 |
| APPLICATION NO. | : 12/123244 | |
| DATED | : November 3, 2009 | |
| INVENTOR(S) | : Megaw | |

It is certified that error appears in the above-identified patent and that said Letters Patent is hereby corrected as shown below:

In column 1, line 29, delete "for" and insert -- or --, therefor.

In column 4, line 32, delete "arrangement" and insert -- arrangements --, therefor.

In column 6, line 46, delete "FIG. 22" and insert -- FIG. 2 --, therefor.

In column 7, line 35, delete "/" and insert -- load --, therefor.

In column 8, line 46, delete "transcoductances" and insert -- transconductances --, therefor.

In column 8, line 48, after "signal" insert -- analysis --.

In column 8, line 52, delete "Zload=" and insert -- $Z_{LOAD}=$ --, therefor.

Signed and Sealed this

Seventeenth Day of August, 2010

David J. Kappos
*Director of the United States Patent and Trademark Office*